(12) United States Patent
Perzlmaier et al.

(10) Patent No.: US 9,917,229 B2
(45) Date of Patent: Mar. 13, 2018

(54) ELECTRICAL CONTACT STRUCTURE FOR A SEMICONDUCTOR COMPONENT, AND SEMICONDUCTOR COMPONENT

(71) Applicant: OSRAM Opto Semiconductors GmbH, Regensburg (DE)

(72) Inventors: Korbinian Perzlmaier, Regensburg (DE); Bjoern Muermann, Regensburg (DE); Karl Engl, Pentling (DE); Christian Eichinger, Wenzenbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/313,531

(22) PCT Filed: May 22, 2015

(86) PCT No.: PCT/EP2015/061387
§ 371 (c)(1),
(2) Date: Nov. 22, 2016

(87) PCT Pub. No.: WO2015/181071
PCT Pub. Date: Dec. 3, 2015

(65) Prior Publication Data
US 2017/0200860 A1 Jul. 13, 2017

(30) Foreign Application Priority Data
May 28, 2014 (DE) .................. 10 2014 107 555

(51) Int. Cl.
*H01L 33/38* (2010.01)
*H01L 33/42* (2010.01)
(Continued)

(52) U.S. Cl.
CPC ...... *H01L 33/38* (2013.01); *H01L 31/022466* (2013.01); *H01L 33/42* (2013.01);
(Continued)

(58) Field of Classification Search
CPC .................. H01L 33/38; H01L 33/392; H01L 31/022466; H01L 51/445; H01L 51/5215
See application file for complete search history.

(56) References Cited

U.S. PATENT DOCUMENTS 5,528,071 A * 6/1996 Russell ................. H01L 31/105
257/414
2003/0207480 A1 11/2003 Kobayashi et al.
(Continued)

FOREIGN PATENT DOCUMENTS

EP 1968124 A1 9/2008
TW 201017930 A 5/2010
(Continued)

*Primary Examiner* — Phuc Dang
(74) *Attorney, Agent, or Firm* — McDermott Will & Emery LLP

(57) ABSTRACT

An electrical contact structure (10) for a semiconductor component (100) is specified, comprising a transparent electrically conductive contact layer (1), on which a first metallic contact layer (2) is applied, a second metallic contact layer (3), which completely covers the first metallic contact layer (2), and a separating layer (4), which is arranged between the transparent electrically conductive contact layer (1) and the second metallic contact layer (3) and which separates the second metallic contact layer (3) from the transparent electrically conductive contact layer (1).

Figure 1A:
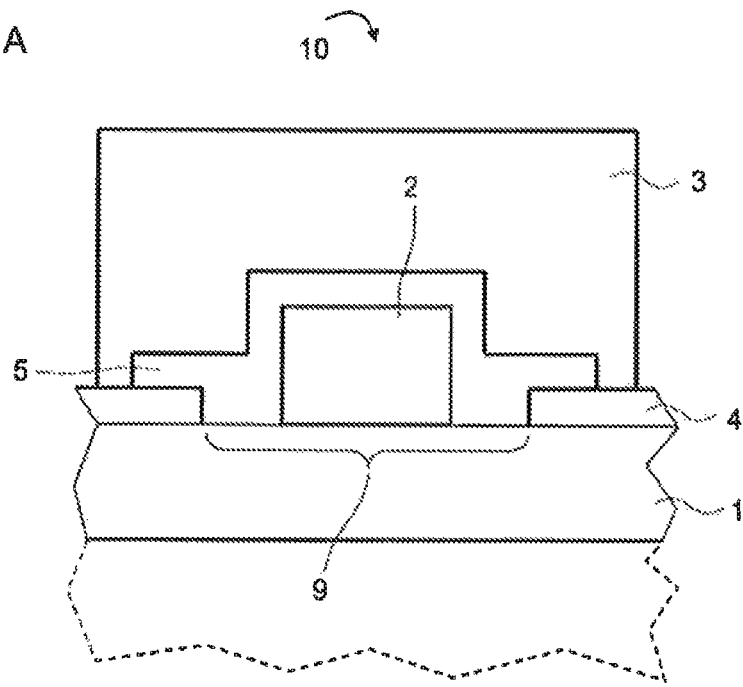

Furthermore, a semiconductor component (100) comprising a contact structure (10) is specified.

20 Claims, 4 Drawing Sheets

(51) Int. Cl.
*H01L 51/52* (2006.01)
*H01L 51/44* (2006.01)
*H01L 31/0224* (2006.01)

(52) U.S. Cl.
CPC ........ *H01L 51/445* (2013.01); *H01L 51/5215* (2013.01); *H01L 51/5234* (2013.01)

(56) References Cited

U.S. PATENT DOCUMENTS

| | | |
|---|---|---|
| 2004/0256631 A1 | 12/2004 | Shin |
| 2004/0256632 A1 | 12/2004 | Stein et al. |
| 2007/0117235 A1 | 5/2007 | Stein et al. |
| 2008/0178925 A1* | 7/2008 | Wu ................ H01L 31/022433 136/244 |
| 2010/0047943 A1 | 2/2010 | Lee et al. |
| 2010/0127635 A1* | 5/2010 | Yao ....................... H01L 33/382 315/291 |
| 2011/0089401 A1 | 4/2011 | Hiraiwa et al. |
| 2012/0025249 A1 | 2/2012 | Jeong et al. |
| 2012/0223356 A1 | 9/2012 | Suzuki |
| 2013/0011953 A1 | 1/2013 | Nakajo et al. |
| 2013/0214320 A1 | 8/2013 | Onishi et al. |

FOREIGN PATENT DOCUMENTS

| | | |
|---|---|---|
| TW | 201205857 A | 2/2012 |
| WO | 2007085218 A1 | 8/2007 |
| WO | 2014012760 A1 | 1/2014 |

\* cited by examiner

ELECTRICAL CONTACT STRUCTURE FOR A SEMICONDUCTOR COMPONENT, AND SEMICONDUCTOR COMPONENT

This patent application claims the priority of German patent application 10 2014 107 555.2, the disclosure content of which is hereby incorporated by reference.

An electrical contact structure for a semiconductor component and a semiconductor component are specified.

At least one object of specific environments is to specify an electrical contact structure for a semiconductor component which preferably allows the semiconductor component to be contacted reliably. At least one further object of specific embodiments is to specify a semiconductor component comprising such an electrical contact structure.

These objects are achieved by means of subjects according to the independent patent claims. Advantageous embodiments and developments of the subjects are characterized in the dependent claims and are furthermore evident from the following description and the drawings.

In accordance with at least one embodiment, an electrical contact structure for a semiconductor component comprises a transparent electrically conductive contact layer. The electrical contact structure can be designed, in particular, for electrically contacting the semiconductor component. The electrical contact can be effected in particular by means of the transparent electrically conductive contact layer.

In accordance with a further embodiment, a semiconductor component comprises the electrical contact structure on a surface of a semiconductor layer sequence. In particular, the semiconductor component can comprise a substrate, on which the semiconductor layer sequence is applied. The surface on which the electrical contact structure is arranged can be, in particular, a top side of the semiconductor layer sequence facing away from the substrate, such that the electrical contact structure constitutes a top side contact for electrically contacting the semiconductor layer sequence. The semiconductor layer sequence can thus be arranged between the substrate and the electrical contact structure.

The features described here and hereinafter apply equally to the electrical contact structure and to the semiconductor component comprising the electrical contact structure.

In accordance with a further embodiment, the electrical contact structure comprises a first metallic contact layer. The first metallic contact layer is arranged in particular on the transparent electrically conductive contact layer.

In accordance with a further embodiment, the electrical contact structure comprises a second metallic contact layer, which completely covers the first metallic contact layer. This can mean, in particular, that the second metallic contact layer, as viewed from the transparent electrically conductive contact layer, is arranged above the first metallic contact layer and furthermore has a larger extent in a lateral direction than the first metallic contact layer. Here and hereinafter, a lateral direction denotes a direction along the main extension plane of the transparent electrically conductive contact layer. In particular, the second metallic contact layer can project beyond the first metallic contact layer at least in one or else in all lateral directions, such that in a plan view of the second metallic contact layer the second metallic contact layer is wider than the first metallic contact layer in at least one or else in all lateral directions.

In accordance with a further embodiment, the electrical contact structure comprises a separating layer, which is arranged between the transparent electrically conductive contact layer and the second metallic contact layer and which separates the second metallic contact layer from the transparent electrically conductive contact layer. Here and hereinafter, the fact that two layers are separated by a further layer means that the two layers have no direct contact with one another at least partly on account of the separating layer. In the case of the electrical contact structure described here, this means, in particular, that the second metallic contact layer has no direct immediate and physical contact with the transparent electrically conductive contact layer. In particular, the separating layer can separate the second metallic contact layer from the transparent electrically conductive contact layer in the regions in which the transparent electrically conductive contact layer is not covered by the first metallic contact layer and, if appropriate, is also not covered by a barrier layer and in which the second metallic contact layer would directly contact the transparent electrically conductive contact layer in the absence of the separating layer.

In accordance with a further embodiment, the electrical contact structure comprises a barrier layer between the first and second metallic contact layers, which barrier layer completely covers the first metallic contact layer and is covered, preferably completely, by the second metallic contact layer. In particular, the barrier layer arranged between the first and second metallic contact layers is provided for separating the first and second metallic contact layers from one another, such that the first and second metallic contact layers have no direct or physical contact with one another. The barrier layer can be arranged on the first metallic contact layer in particular directly and in physical contact therewith. The second metal layer can be arranged on the barrier layer in particular directly and in physical contact therewith. The barrier layer can thus be in direct contact both with the first metal layer and with the second metal layer.

In the case of the electrical contact structure described here, the first metallic contact layer can be arranged on the transparent electrically conductive contact layer in particular directly and in physical contact therewith. Furthermore, particularly preferably, the separating layer can be arranged on the transparent electrically conductive contact layer directly and in physical contact therewith. This means in other words that the first metallic contact layer and the separating layer are arranged alongside one another, that is to say adjacently to one another in a lateral direction, on the transparent electrically conductive contact layer. In this case, the separating layer can be spaced apart from the first metallic contact layer, such that there is a gap between the first metallic contact layer and the separating layer in a lateral direction. In the gap, the transparent electrically conductive contact layer is covered neither by the first metallic contact layer nor by the separating layer. In this case, the separating layer can have an opening in which the first metallic contact layer is arranged, wherein the opening has a larger extent in a lateral direction than the first metallic contact layer. If the electrically conductive contact structure comprises a barrier layer between the first and second metallic contact layers, then a portion of the barrier layer can be arranged in the gap between the separating layer and the first metallic contact layer, such that a portion of the barrier layer is arranged between the first metallic contact layer and the separating layer in a lateral direction. The barrier layer can thus be arranged directly on the transparent electrically conductive contact layer in a region surrounding the first metallic contact layer.

As an alternative thereto, it may also be possible that the separating layer extends as far as the first metallic contact layer or even extends as far as below the first metallic contact layer, wherein the separating layer in this case has an opening in which a portion of the first metallic contact layer extends through the separating layer to the transparent electrically conductive contact layer. If the electrical contact structure comprises a barrier layer between the first and second metallic contact layers, then in the abovementioned cases said barrier layer can respectively have a region arranged on the separating layer, such that the barrier layer can extend over a portion of the separating layer and over the first metallic contact layer. The barrier layer can therefore partly cover the separating layer. In this case, the barrier layer can be arranged directly and in physical contact on a portion of the separating layer.

In accordance with a further embodiment, the electrical contact structure particularly preferably comprises a transparent electrically conductive contact layer, on which the first metallic contact layer is applied, wherein the second metallic contact layer is applied on the first metallic contact layer such that the first metallic contact layer is completely covered by the second metallic contact layer, and wherein a separating layer is arranged between the transparent electrically conductive contact layer and the second metallic contact layer and separates the second metallic contact layer from the transparent electrically conductive contact layer. Furthermore, it may also be particularly preferred if the barrier layer is arranged between the first and second metallic contact layers, which barrier layer completely covers the first metallic contact layer and is covered by the second metallic contact layer.

In accordance with a further embodiment, in a method for producing the contact structure for a semiconductor component, the transparent electrically conductive contact layer is applied on a semiconductor layer sequence. The first metallic contact layer is applied on the transparent electrically conductive contact layer. Furthermore, the separating layer is applied on the transparent electrically conductive contact layer. In this case, the separating layer can be applied before or after the first metallic contact layer. In particular, the separating layer is provided with at least one or a plurality of openings in which the first metallic contact layer is arranged. If the first metallic contact layer is applied before the separating layer, the at least one or the plurality of openings in the separating layer have at least the corresponding dimensions of the first metallic contact layer in a lateral direction. If the separating layer is applied before the first metallic contact layer, the first metallic contact layer can also have a larger lateral extent than the openings in the separating layer, such that in this case the first metallic contact layer is partly applied on the separating layer and the separating layer extends below the first metallic contact layer. The separating layer can be applied for example by means of chemical vapour deposition (CVD) or physical vapour deposition (PVD) or by means of atomic layer deposition (ALD). In this case, it is possible for the separating layer to be applied in a patterned manner for example by means of a mask. Furthermore, the separating layer can also be applied in an unpatterned manner and over a large area and can subsequently be removed by means of a suitable patterning method, for example a photolithographic method or a laser ablation method, in the regions in which the first metallic contact layer is arranged or is intended to be arranged. In this case, it may also be possible for a portion of the transparent electrically conductive contact layer also to be removed during the production of the opening in the separating layer, for example in the context of an etching method, such that the transparent electrically conductive contact layer can have a smaller thickness in the region of the opening of the separating layer than in regions below the remaining separating layer.

Furthermore, the second metallic contact layer is applied on the first metallic contact layer and on a portion of the separating layer, such that the second metallic contact layer completely covers the first metallic contact layer and the second metallic contact layer is separated from the transparent electrically conductive contact layer by the separating layer in regions in which said second metallic contact layer could directly contact or touch the transparent electrically conductive contact layer in the absence of the separating layer. The metallic contact layers can be applied by means of a vapour deposition method, for example. In particular, the transparent electrically conductive contact layer can be applied on a top side of a semiconductor layer sequence, wherein the top side is a side of the semiconductor layer sequence which faces away from a substrate on which the semiconductor layer sequence is applied.

In accordance with a further embodiment, the separating layer projects below the second metallic contact layer. That means in other words that in a plan view of the electrical contact structure the separating layer has a larger lateral extent than the second metallic contact layer. The second metallic contact layer correspondingly covers a portion of the separating layer.

In accordance with a further embodiment, the separating layer covers the transparent electrically conductive layer over a large area apart from a region surrounding the first metallic contact layer. This can mean, in particular, that the separating layer completely covers the transparent electrically conductive layer or even covers it apart from that region in which the first metallic contact layer and, if appropriate, also the barrier layer are arranged directly on the transparent electrically conductive contact layer.

In accordance with a further embodiment, the transparent electrically conductive contact layer comprises an electrically conductive transparent oxide or oxynitride or is composed thereof. Such oxides are also designated as "transparent conductive oxides", TCOs for short, and corresponding oxynitrides as TCONs. The TCO or TCON is in particular a metal oxide or metal oxynitride such as, for example, zinc oxide, zinc oxynitride, tin oxide, cadmium oxide, titanium oxide, indium oxide, indium tin oxide (ITO) or indium tin oxynitride. Alongside binary metal-oxygen compounds, ternary metal-oxygen compounds such as, for example, $Zn_2SnO_4$ or mixtures of different transparent conductive oxides also belong to the group of TCOs. The same correspondingly applies to the transparent conductive oxynitrides. Furthermore, the TCOs and TCONs do not necessarily correspond to a stoichiometric composition and can also be p- or n-doped. Particularly preferably, the transparent electrically conductive contact layer can comprise or be composed of an indium-containing oxide or oxynitride, for example indium tin oxide or indium tin oxynitride. The transparent electrically conductive contact layer can have a thickness of greater than or equal to 20 nm or greater than or equal to 40 nm and less than or equal to 300 nm.

In accordance with a further embodiment, the first metallic contact layer comprises aluminium or is composed thereof. Aluminium can be particularly suitable for contacting a transparent electrically conductive contact layer composed of an indium-containing oxide or oxynitride, since no undesirable reactions between the aluminium and the material of the transparent electrically conductive contact layer take place which might impair the electrical contact between the first metallic contact layer and the transparent electrically conductive contact layer. Furthermore, the first metallic contact layer can also be embodied in a multilayered fashion, wherein in this case particularly preferably at least one layer comprises aluminium or is composed thereof. The first metallic contact layer can have a thickness of greater than or equal to 20 nm or greater than or equal to 50 nm or greater than or equal to 100 nm and less than or equal to 200 nm.

In accordance with a further embodiment, the second metallic contact layer comprises gold or is composed thereof. The second metallic contact layer may thereby be distinguished by low sensitivity towards substances, in particular gases, from the environment which might damage other materials as a result of oxidation processes, for example. Furthermore, a portion of the second metallic contact layer composed of gold can be embodied as a bonding pad that enables the electrical contact structure to be electrically contacted externally. The second metallic contact layer can have a thickness of greater than or equal to 1 μm and less than or equal to 4 μm. The second metallic contact layer can furthermore also be embodied in a multi-layered fashion and in this case particularly preferably comprise at least one layer which comprises gold or is composed thereof. A covering layer comprising or composed of titanium and/or nickel, for example, can be present on the gold layer. The covering layer can preferably have a thickness of greater than or equal to 1 nm and less than or equal to 10 nm.

The electrical contact structure described here is based on the consideration that in particular gold in direct contact with a TCO or TCON such as ITO, can lead to a reaction between the gold and the constituents of the TCO or TCON, between the gold and indium from the TCO or TCON in the example mentioned. Such a reaction can lead to a reduction of the conductivity of the TCO or TCON and thus to an increase in the operating voltage of a semiconductor component which is electrically contacted with such a contact structure. Likewise, in some instances "efflorescence" in the form of reaction products of gold and indium can be observed at the metal structure edges. The electrical contact structure described here comprising the separating layer that separates the second metallic contact layer from the transparent electrically conductive contact layer makes it possible to prevent a direct contact between the second metallic contact layer, that is to say preferably the gold forming the second metallic contact layer, and a TCO or TCON forming the transparent electrically conductive contact layer, such that the disadvantages described above do not occur in the case of the electrical contact structure described here.

In accordance with a further embodiment, the barrier layer comprises one or a plurality of materials selected from Ti, Pt, W, Ni and compounds comprising these. Particularly preferably, the barrier layer can comprise or be composed of one or a plurality of layers composed of Ti, Pt, TiW, TiWN, W and/or Ni.

In accordance with a further embodiment, the separating layer is transparent. Particularly for the case where the separating layer covers the top side of the semiconductor layer sequence of the semiconductor component over a large area and the semiconductor component is embodied as a light-emitting or light-detecting semiconductor component, light can be emitted by the semiconductor component or light can be radiated into the semiconductor layer sequence of the semiconductor component through the transparent separating layer and also through the transparent electrically conductive contact layer in the regions in which no first and second metallic contact layers are present.

In accordance with a further embodiment, the separating layer comprises a dielectric material, that is to say an electrically non-conductive material, or consists thereof. In particular, the separating layer can comprise an inorganic material or consist thereof. The inorganic material can comprise or consist of an oxide, nitride or oxynitride, in particular. In particular, the inorganic material can be selected from one or a plurality of the following materials: aluminium oxide, zinc oxide, zirconium oxide, titanium oxide, hafnium oxide, lanthanum oxide, tantalum oxide, niobium oxide, silicon nitride, silicon dioxide, silicon oxynitride. The separating layer can comprise or be composed of, in particular, one or a plurality of layers composed of one or a plurality of the inorganic materials mentioned, particularly preferably at least one layer composed of silicon dioxide. The separating layer can have a thickness of greater than or equal to 1 nm or greater than or equal to 5 nm or greater than or equal to 10 nm or greater than or equal to 40 nm or greater than or equal to 50 nm or greater than or equal to 100 nm or greater than or equal to 200 nm. Furthermore, the separating layer can have a thickness of less than or equal to 1 μm or less than or equal to 500 nm or less than or equal to 300 nm. If the separating layer comprises a plurality of layers, then the separating layer is preferably not embodied as a Bragg mirror for such wavelengths which are intended to pass through the separating layer. In the case of a light-emitting semiconductor component, these are, in particular, wavelengths of the light generated in the semiconductor layer sequence, and, in the case of a light-detecting semiconductor component, they are, in particular, wavelengths of light that is intended to be detected in the semiconductor layer sequence.

In accordance with a further embodiment, the semiconductor layer sequence is applied directly to the substrate, which is particularly preferably a growth substrate on which the semiconductor layer sequence is grown epitaxially. In this case, the semiconductor layer sequence and the growth substrate preferably touch one another over the whole area. The substrate can be a sapphire substrate. It is possible in this case for the substrate to have a patterning at a side facing the semiconductor layer sequence. In the case of a sapphire substrate, the substrate can then be embodied as a so-called patterned sapphire substrate (PSS). Furthermore, the substrate can comprise or be composed of, for example, SiC or Si, GaAs, GaN, InGaAlP, Ge, wherein this can also have a patterning described above.

In accordance with at least one embodiment, the transparent electrically conductive contact layer is in direct contact with the semiconductor layer sequence at least in places. That is to say that the transparent electrically conductive contact layer touches the semiconductor layer sequence in places.

Particularly preferably, the transparent electrically conductive contact layer can completely cover the semiconductor layer sequence apart from an edge region in which the top side of the semiconductor layer sequence adjoins side surfaces of the semiconductor layer sequence. Furthermore, the transparent electrically conductive contact layer can completely cover the semiconductor layer sequence apart from the edge region and a region in which the bonding pad for externally making electrical contact with the semiconductor component is arranged on the semiconductor layer sequence. In other words, in this case no transparent electrically conductive contact layer is arranged between the bonding pad and the semiconductor layer sequence, which in this region has an opening in which the bonding pad is arranged.

In accordance with a further embodiment, the transparent electrically conductive contact layer is applied directly to a main surface of a p-doped layer, for example of a p-doped GaN layer, of the semiconductor layer sequence in places or over the whole area. It is also possible for an electrically insulating layer, for instance composed of silicon oxide or silicon nitride, to be situated in places between the transparent electrically conductive contact layer and the semiconductor layer sequence. Said electrically insulating layer, embodied as an electrical blocking layer, can be arranged in particular below the first and second metallic contact layers between the transparent electrically conductive contact layer and the semiconductor layer sequence. The blocking layer is preferably completely covered by the transparent electrically conductive contact layer and is enclosed by the latter and the semiconductor layer sequence.

In accordance with a further embodiment, the semiconductor layer sequence comprises a plurality of semiconductor layers and at least one active zone. The active zone can comprise or be composed of, for example, an optoelectronically active region in the form of a light-emitting or light-detecting semiconductor layer. In this case, the semiconductor component is embodied in particular as a light-emitting or light-detecting semiconductor component, for example as a light-emitting diode chip, laser diode chip or photodiode chip. In this case, the semiconductor component can be designed for generating or detecting electromagnetic radiation, in particular in the near ultraviolet, in the visible and/or in the infrared spectral range. Preferably, the semiconductor component is designed for emitting or detecting light in a wavelength range of between 340 nm and 820 nm inclusive or between 380 nm and 780 nm inclusive. Furthermore, the semiconductor component can also be some other electronic chip without optoelectronic properties.

In accordance with a further embodiment, the semiconductor component is embodied as an inorganic semiconductor component, in particular as a semiconductor chip. By way of example, in this case the semiconductor chip can be embodied as a light-emitting diode chip or as a photodiode chip. In this case, the semiconductor layer sequence can preferably be based on a III-V compound semiconductor material. The semiconductor material is for example a nitride compound semiconductor material such as $Al_xIn_{1-x-y}Ga_yN$ or a phosphide compound semiconductor material such as $Al_xIn_{1-x-y}Ga_yP$, or else an arsenide compound semiconductor material such as $Al_xIn_{1-x-y}Ga_yAs$, wherein $0 \leq x \leq 1$, $0 \leq y \leq 1$ and $x+y \leq 1$ hold true in each case. The semiconductor layer sequence here can comprise dopants and additional constituents. For the sake of simplicity, however, only the essential constituents of the crystal lattice of the semiconductor layer sequence, that is to say Al, As, Ga, In, N or P, are indicated, even if these can be replaced and/or supplemented in part by small amounts of further substances. Preferably, the semiconductor layer sequence is based on AlInGaN and comprises at least one n-doped layer and at least one p-doped layer, wherein an active zone is situated between these two layers.

The semiconductor component can furthermore also be embodied as a solar cell, for example as a solar cell which is based on silicon.

Furthermore, it may also be possible for the semiconductor component to be embodied as an organic semiconductor component, in particular as an optoelectronically active organic semiconductor component comprising a semiconductor layer sequence formed by organic semiconductor layers. In this case, the semiconductor component can be embodied in particular as an organic light-emitting diode or else as an organic photodiode or organic solar cell.

In accordance with a further embodiment, the transparent electrically conductive contact layer forms a current spreading layer. An electric current which is fed into the second and thus also into the first metallic contact layer and hence also into the transparent electrically conductive contact layer for operation of the semiconductor component can be fed into the semiconductor layer sequence over a large area through the transparent electrically conductive contact layer, such that it can be possible for the active zone of the semiconductor layer sequence to be energized as areally uniformly as possible.

In accordance with a further embodiment, the electrical contact structure comprises a bonding pad and/or one or a plurality of conduction webs for current spreading or forms such structures. In particular, by way of example, the first and second metallic contact layers can form one or a plurality of conduction webs for current spreading which extend over the transparent electrically conductive contact layer. A portion of the second metallic contact layer can also form a bonding pad.

In accordance with a further embodiment, the semiconductor component has side surfaces adjacent to the top side, wherein the separating layer extends at least partly over the side surfaces and thus reaches at least partly over the side surfaces. As a result, the separating layer, which, as described above, particularly preferably comprises or is composed of a dielectric material, can serve as a passivation layer of the side surfaces of the semiconductor component. As an alternative thereto, it can also be possible for the separating layer to be arranged only on the top side of the semiconductor layer sequence, for example also only on the transparent electrically conductive contact layer. In this case, it can be advantageous if the semiconductor component comprises a passivation layer in addition to the separating layer, which covers at least one portion of the side surfaces and at least one portion of the separating layer on the top side. The passivation layer can also completely cover the top side of the semiconductor component apart from a bonding pad on the top side of the semiconductor layer sequence, in particular the entire electrical contact structure apart from a bonding pad. The passivation layer can comprise one or a plurality of the materials mentioned above for the separating layer.

Further advantages, advantageous embodiments and developments will become apparent from the exemplary embodiments described below in association with the figures.

IN THE FIGURES

Figure 1B:
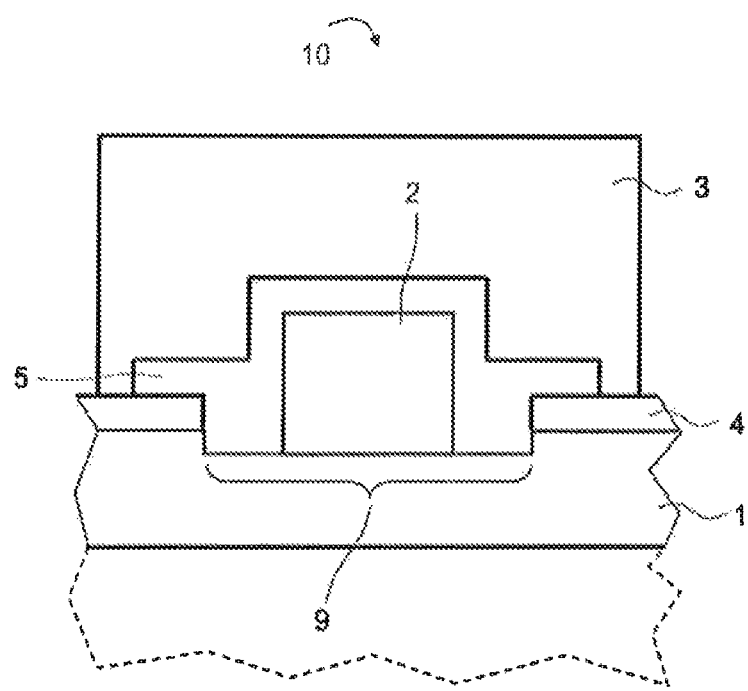
Figure 2:
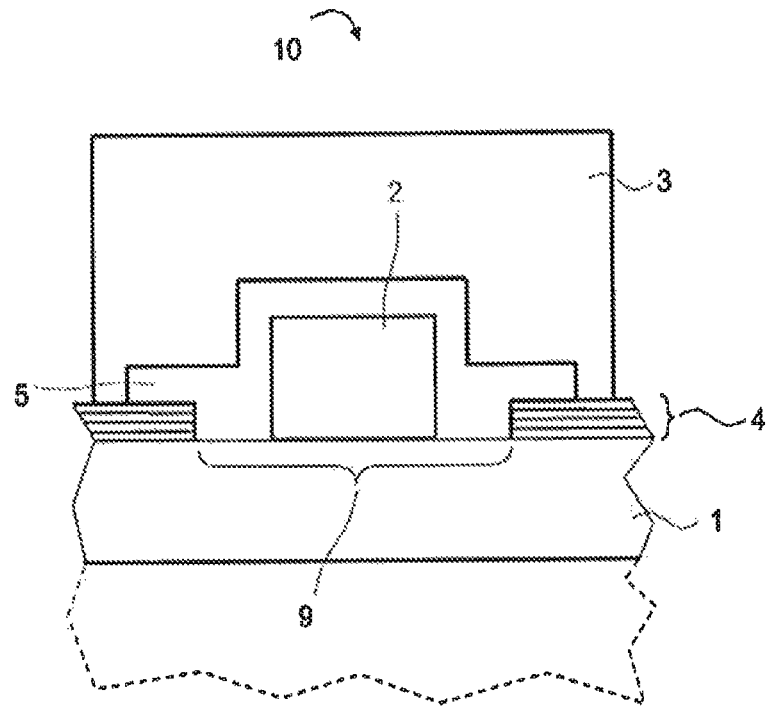
Figure 3A:
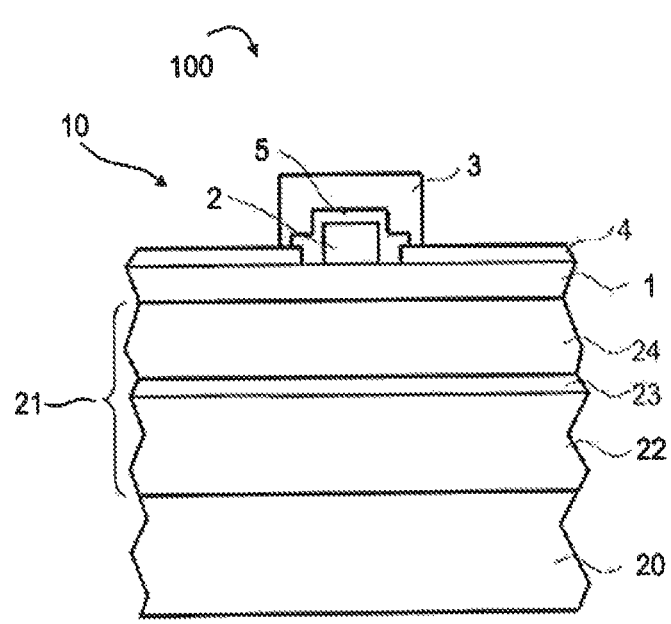
Figure 3B:
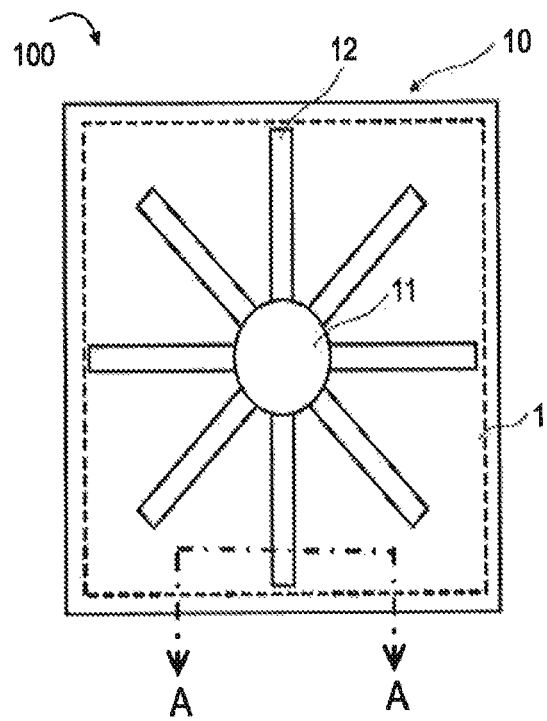
Figure 4:
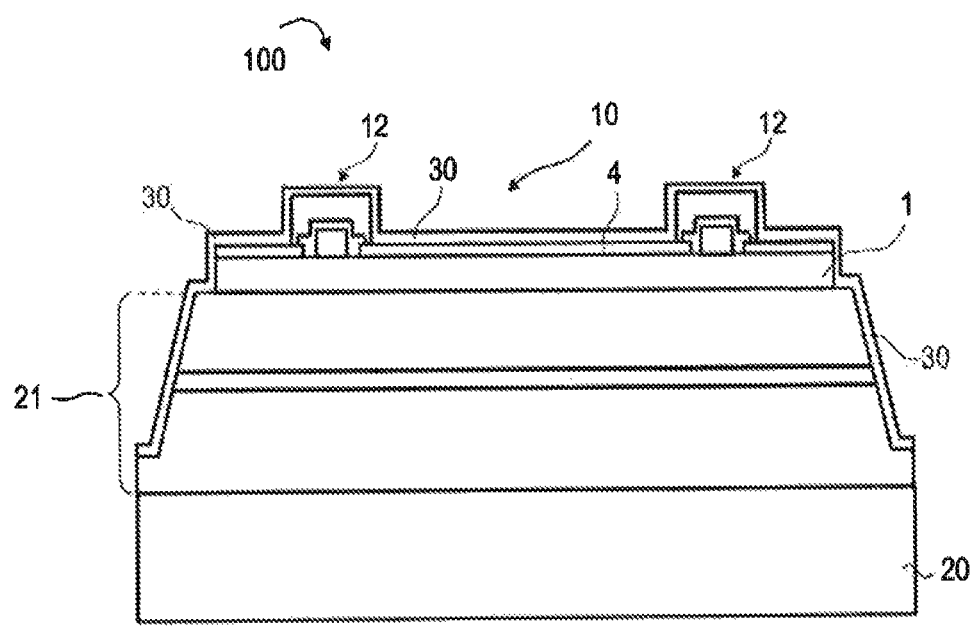
Figure 5:
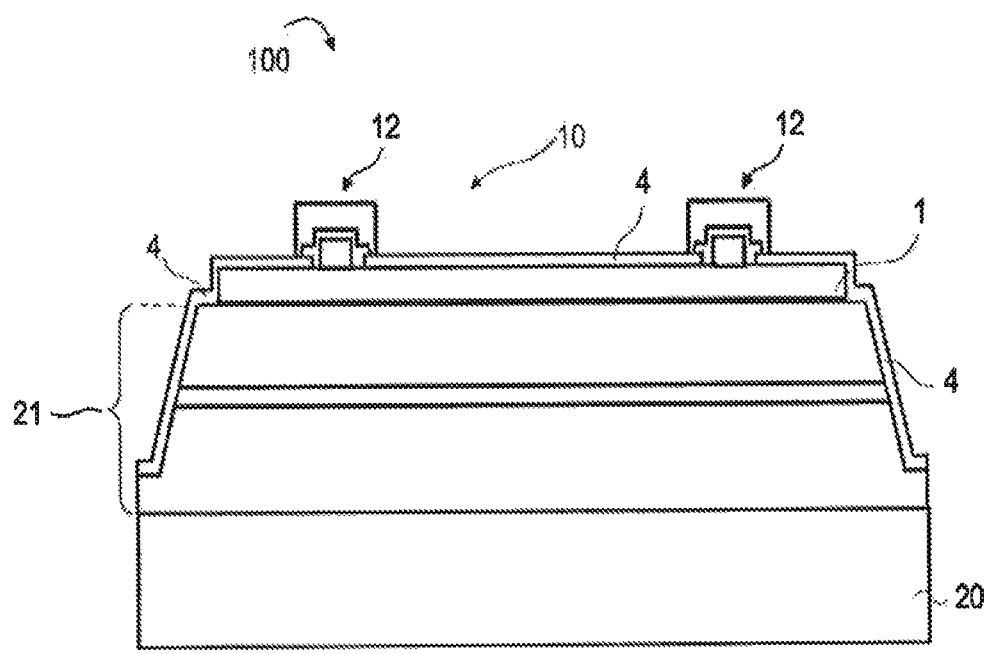

FIG. 1A shows an electrical contact structure for a semiconductor component in accordance with one exemplary embodiment, FIG. 1B shows an electrical contact structure for a semiconductor component in accordance with a further exemplary embodiment, FIG. 2 shows an electrical contact structure for a semiconductor component in accordance with a further exemplary embodiment, FIGS. 3A and 3B show views of a semiconductor component comprising an electrical contact structure in accordance with a further exemplary embodiment, and FIGS. 4 and 5 show semiconductor components comprising electrical contact structures in accordance with further exemplary embodiments.

In the exemplary embodiments and figures, elements that are identical, of identical type or act identically can be provided with the same reference signs in each case. The illustrated elements and their size relationships among one another should not be regarded as true to scale; rather, individual elements, such as layers, component parts, components and regions, for example, may be illustrated with exaggerated size in order to enable better illustration and/or in order to afford a better understanding.

FIG. 1A shows one exemplary embodiment of an electrical contact structure 10 for a semiconductor component. The electrical contact structure 10 can be arranged for example on a semiconductor layer sequence of a semiconductor component, wherein the semiconductor component or the semiconductor layer sequence is indicated as an excerpt by the dashed line.

The electrical contact structure 10 comprises a transparent electrically conductive contact layer 1, which can be applied for example directly on a semiconductor layer sequence of a semiconductor component. The transparent electrically conductive contact layer 1 comprises a transparent electrically conductive oxide or oxynitride. In particular, the transparent electrically conductive contact layer 1 comprises an indium-containing oxide or oxynitride, in particular indium tin oxide or indium tin oxynitride, in the exemplary embodiment shown. The transparent electrically conductive contact layer 1 serves firstly for current spreading of a current which can be fed into a semiconductor component via the electrical contact structure 10. For this purpose, the electrical contact structure 10 is preferably applied over a large area on a semiconductor layer sequence of a semiconductor component. Furthermore, the transparent electrically conductive contact layer 1 in the case of an optoelectronic semiconductor component, in particular of a light-emitting or light-detecting semiconductor component, can be provided and designed to the effect that light which is generated in the semiconductor component or detected by the semiconductor component can pass through the transparent electrically conductive contact layer 1. The transparent electrically conductive contact layer 1 has a thickness of greater than or equal to 20 nm and less than or equal to 300 nm.

A first metallic contact layer 2 is applied on the transparent electrically conductive contact layer 1. The first metallic contact layer 2 can comprise or be composed of aluminium, in particular. The first metallic contact layer 2 has a thickness of greater than or equal to 20 nm and less than or equal to 200 nm and is applied directly on the transparent electrically conductive contact layer 1, that means with direct physical and electrical contact therewith. A second metallic contact layer 3 is arranged on the first metallic contact layer 2 and completely covers the first metallic contact layer 2. For this purpose, the second metallic contact layer 3 has a greater width than the first metallic contact layer 2 in a lateral direction, that means in a direction along the main extension plane of the transparent and electrically conductive contact layer 1, such that the second metallic contact layer 3 projects laterally beyond the first metallic contact layer 2. The second metallic contact layer 3 comprises gold or is composed of gold and has a thickness of greater than or equal to 1 μm and less than or equal to 4 μm. While the first metallic contact layer 2 serves for electrical connection of the transparent electrically conductive contact layer 1, the second metallic contact layer 3 can form for example a termination of the electrical contact structure 10 towards the outside and for example also serve at least in one part as a bonding pad for external electrical connection of the electrical contact structure 10. The first metallic contact layer 2 and/or the second metallic contact layer 3, as is described above in the general part, can also be embodied in a multilayered fashion as an alternative to the respective monolayer embodiment shown in the present exemplary embodiment.

Furthermore, a separating layer 4 is arranged between the transparent electrically conductive contact layer 1 and the second metallic contact layer 3 and separates the second metallic contact layer 3 from the transparent electrically conductive contact layer 1. The separating layer 4 can prevent in particular a direct contact between the second metallic contact layer 3 and the transparent electrically conductive contact layer 1 in the regions in which the second metallic contact layer 3 would bear directly on the transparent electrically conductive contact layer 1 and be in contact therewith in the absence of the separating layer 4 and the barrier layer 5 described below. Particularly in the case of the materials described in the exemplary embodiment shown, that is to say gold for the second metallic contact layer 3 and an indium-containing TCO or TCON for the transparent electrically conductive contact layer 1, a reaction between the gold and constituents of the transparent electrically conductive contact layer, in particular indium, could occur in the event of such direct contact between the layers 1 and 3. This could lead to a reduction in the conductivity of the transparent electrically conductive contact layer 1 and also to "efflorescence" in the form of reaction products of gold and indium at the metal structure edges. Such undesirable effects can be avoided on account of the separating layer 4.

The separating layer 4 has a thickness of greater than or equal to 1 nm and less than or equal to 300 nm, wherein the separating layer 4 in particular below the second metallic contact layer 3 is thick enough to form a hole-free barrier between the transparent electrically conductive contact layer 1 and the second metallic contact layer 3.

In the exemplary embodiment shown, a barrier layer 5 is furthermore arranged between the first and second metallic contact layers 2, 3, which barrier layer completely covers the first metallic contact layer 2 and is in turn covered by the second metallic contact layer 3. In particular, the barrier layer 5 is completely covered by the second metallic contact layer 3 in the exemplary embodiment shown. As an alternative to the barrier layer 5 being completely covered by the second metallic contact layer 3 as shown, the barrier layer 5 and the second metallic contact layer 3 can for example also jointly extend out thinly towards the edge. A separation of the metallic contact layers 2, 3 can be achieved by the barrier layer 5, such that a diffusion of material between the first and second metallic contact layers 2, 3 can be prevented. The barrier layer 5 comprises one or a plurality of layers, for example comprising or composed of Ti, Pt, W, Ni, TiW or TiWN.

The separating layer 4 is embodied as transparent, in particular, such that, as described further above for the transparent electrically conductive contact layer 1, light can pass through the electrical contact structure 10 in the regions in which no metal layers 2, 3 are present. In particular, the separating layer 4 comprises a dielectric material, which can be selected in particular from an oxide, nitride or oxynitride. Particularly preferably, the separating layer 4 is composed of silicon dioxide. As an alternative thereto, other materials mentioned above in the general part are also possible.

As can be discerned in FIG. 1A, the separating layer 4 projects below the second metallic contact layer 3 and preferably covers the transparent electrically conductive contact layer 1 in the regions in which no first metal layer 2 and, if appropriate, no barrier layer 5 are present.

The electrical contact between the transparent electrically conductive contact layer 1 and the further electrically conductive layers arranged thereabove, that is to say the metallic contact layers 2, 3 and the barrier layer 5 in the exemplary embodiment shown, is effected in the region 9 corresponding to an opening in the separating layer 4. In the exemplary embodiment shown, the opening in the separating layer 4, with regard to its lateral extent, is larger than the lateral extent of the first metallic contact layer 2, such that the barrier layer 5 likewise present in the exemplary embodiment shown is arranged between the first metallic contact layer 2 and the separating layer 4 in a lateral direction and is in direct contact with the transparent electrically conductive contact layer 1 in this region alongside the first metallic contact layer 2. The barrier layer 5 is furthermore arranged on a portion of the separating layer 4.

Furthermore, the opening in the separating layer 4 and thus the region 9 that is free of the separating layer 4 can have a lateral extent corresponding to the lateral extent of the first metallic contact layer 2, such that in this case the separating layer 4 would extend as far as the first metallic contact layer 2. Furthermore, it can also be possible for the separating layer 4 to extend below the first metallic contact layer 2.

In order to produce the electrical contact structure 10, the transparent electrically conductive contact layer 1 is applied to the surface to be contacted, that is to say for example a surface of a semiconductor layer sequence of a semiconductor component, for example by means of sputtering or vapour deposition. The separating layer 4 is applied to the transparent electrically conductive contact layer 1 for example by means of ALD, CVD or PVD, wherein application can be carried out in a patterned fashion or else over a large area, wherein in the second case a patterning of the separating layer 4 subsequently takes place in order to expose the regions 9 in which the first metallic contact layer 2 is arranged. The first metallic contact layer 2, the second metallic contact layer 3 and, if appropriate, the barrier layer 5 can be applied by vapour deposition, for example.

In the region 9, the transparent electrically conductive contact layer 1 can also have a smaller thickness than in the adjacent regions below the separating layer 4, as is shown in FIG. 1B. The smaller thickness can be produced during the production of an opening forming the region 9 in the separating layer 4, for example, by means of an etching method being used for forming the opening, a portion of the transparent electrically conductive contact layer 1 also being etched by means of said etching method.

FIG. 2 shows a further exemplary embodiment of an electrical contact structure 10, which, in comparison with the previous exemplary embodiment, comprises a separating layer 4 which does not just consist of one layer, but rather comprises a plurality of layers, which can comprise identical or different materials, as described above in the general part. By way of example, the separating layer 4 can comprise or be composed of a silicon dioxide layer and a silicon nitride layer thereon. Furthermore, the separating layer 4 can for example also comprise or be composed of an aluminium oxide or tantalum oxide layer applied by means of ALD, in particular, and a silicon dioxide layer thereon.

The multilayered separating layer 4 is in particular not embodied as a Bragg mirror for such wavelengths which are generated in the semiconductor layer sequence on which the contact structure 10 is formed for example in the case of a light-emitting semiconductor component. In the case of a light-emitting semiconductor component comprising the contact structure 10 shown, it can furthermore be advantageous if the refractive index decreases from layer to layer from the semiconductor layer sequence towards the outermost layer of the separating layer 4 facing the surroundings. Such a stepped reduction in refractive index makes it possible to reduce optical losses when coupling out light from the semiconductor layer sequence into the surroundings through the contact structure 10.

FIGS. 3A and 3B show a sectional illustration and a plan view of a semiconductor component 100 comprising an electrical contact structure 10 that can be embodied in accordance with one of the exemplary embodiments above. The semiconductor component 100 comprises a substrate 20, on which a semiconductor layer sequence 21 is arranged. The electrical contact structure 10 is applied on a top side of the semiconductor layer sequence 21 facing away from the substrate 20. Purely by way of example, the semiconductor component 100 in the exemplary embodiment shown is embodied as an inorganic light-emitting or light-detecting semiconductor chip, that is to say for example as a light-emitting diode chip or photodiode chip. As an alternative thereto, the semiconductor component can for example also be embodied as an inorganic solar cell, an organic light-emitting diode, an organic photodiode or an organic solar cell.

The substrate 20 can be for example a growth substrate on which the semiconductor layer sequence 21 is grown epitaxially. By way of example, the substrate 20 can comprise sapphire or be composed of sapphire. In contrast to the illustration shown, it can also be possible for a top side of the substrate 20 facing the semiconductor layer sequence 21 to be provided with patternings. The substrate 20 can be a so-called "patterned sapphire substrate" (PSS) in this case. As an alternative thereto, the substrate 20 can for example also comprise or be composed of SiC or Si or some other material mentioned above in the general part.

The semiconductor layer sequence 21 comprises semiconductor layers 22, 23, 24, which can be an n-doped semiconductor layer 22, a p-doped semiconductor layer 24 and therebetween an active zone in the form of an optoelectronically active semiconductor layer 23. The semiconductor layer sequence 21 can be based for example on one of the compound semiconductor material systems mentioned above in the general part. By way of example, the semiconductor layer sequence 21 can be based on AlInGaN. In the exemplary embodiment shown, the semiconductor layer 23 can be embodied in particular as a light-emitting or light-detecting semiconductor layer. As an alternative to the construction shown, the semiconductor layer sequence 21 can also comprise further and/or different semiconductor layers. Furthermore, the semiconductor layer sequence 21 can comprise a different active zone having a different functionality, such that the semiconductor component 100 can also be embodied as a non-optoelectronically active semiconductor component.

The electrical contact structure 10, that is to say in particular the transparent electrically conductive contact layer 1, is applied directly on the semiconductor layer 24, that is to say on the p-doped semiconductor layer 24 in the exemplary embodiment shown. As an alternative thereto, the construction of the semiconductor layer sequence 21 can also be reversed, such that the electrical contact structure 10 is applied on an n-doped semiconductor layer. The semiconductor component 100 comprises a further electrical contact for electrically contacting the substrate-side semiconductor layer, said further electrical contact not being shown here or in the subsequent exemplary embodiments for the sake of clarity.

Furthermore, it can also be possible for the semiconductor layer 22, which is an n-doped layer in the exemplary embodiment shown and is arranged below the optoelectronically active layer 23, to be contacted by means of the contact structure 10 described here. For this purpose, the semiconductor layer sequence 21 can have for example an opening produced by means of an etching method, said opening extending through the semiconductor layers 23 and 24 as far as or into the semiconductor layer 22. The contact structure 10 can then be applied on the top side—facing away from the substrate 20—of that region of the semiconductor layer 22 which is exposed by the opening.

Furthermore, it can be possible for the transparent electrically conductive contact layer 1, as is indicated with the aid of the dashed line in FIG. 3B, to cover, and thus make electrical contact with, the entire top side of the semiconductor layer sequence 21 apart from an exposed edge region of the top side of the semiconductor layer sequence 21. Furthermore, it can also be possible for an electrically insulating layer, for example composed of silicon dioxide and/or silicon nitride, which serves as an electrical blocking layer, to be arranged below the metallic contact layers 2, 3 between the transparent electrically conductive contact layer 1 and the semiconductor layer sequence 21, such that no current can be impressed into the semiconductor layer sequence 21 in this region. What can be achieved as a result, particularly in the case of a light-emitting semiconductor component, is that current is impressed into the light-emitting layer 23 preferably in those regions which are covered only by transparent layers, that is to say in particular by the transparent electrically conductive contact layer 1 and the separating layer 4, and from which the light can also emerge from the semiconductor component 100.

As is furthermore shown in FIG. 3B, the electrical contact structure 10 has a bonding pad 11 and a plurality of conduction webs 12 for current spreading. These are formed by the metallic contact layers 2, 3 and, if appropriate, by the barrier layer 5, which are applied on the transparent electrically conductive contact layer 1 in the patterned manner shown. For this purpose, the separating layer 4 has one or a plurality of openings in accordance with the structure of the metallic contact layers 2, 3 applied thereabove. Furthermore, it can also be possible for the bonding pad 11 to consist only of a gold layer, that is to say only of the second metallic contact layer 4, and for no transparent electrically conductive contact layer 1 to be present in the region of the bonding pad 11. Below the bonding pad 11, the transparent electrically conductive contact layer 1 can thus have an opening in which the bonding pad 11 is arranged. The shown structure of the bonding pad 11 and of the conduction webs 12 is purely by way of example and should not be understood to be restrictive. In particular, the structures shown can also have other geometries. The conduction webs 12 can have in particular a width of greater than or equal to 2 μm and less than or equal to 25 μm. In particular, the conduction webs 12 can also have a width of greater than or equal to 3 μm and less than or equal to 12 μm.

FIG. 4 shows a further exemplary embodiment of a semiconductor component 100 embodied as a semiconductor chip, wherein an electrical contact structure 10 having two regions—embodied as conduction webs 12—of the metallic contact layers 2, 3 and the barrier layer 5 are shown purely by way of example in the illustrated sectional illustration. In the exemplary embodiment in FIG. 4, the separating layer 4 is arranged on the transparent electrically conductive contact layer 1 over a large area apart from the regions 9 described above in association with FIG. 1A.

Furthermore, the semiconductor component 100 comprises a passivation layer 30 above the electrical contact structure 10 and above the further top side and also above side surfaces of the semiconductor layer sequence 21 that are adjacent to the top side, said passivation layer thus at least partly also covering the side surfaces of the semiconductor layer sequence 21, in particular the region having the active zone. The side surfaces of the semiconductor layer sequence 21 are formed by mesa edges in the exemplary embodiment shown. In the exemplary embodiment shown, the passivation layer 30 is applied over a large area on the electrical contact structure 10 and completely covers the latter apart from a bonding pad (not shown here). As an alternative thereto, it can also be possible for the passivation layer 30 to cover only a portion of the separating layer 4, for example near the edge region of the top side of the semiconductor layer sequence 21, said edge region not being covered by the transparent electrically conductive contact layer 1 and the separating layer 4, and also side surfaces of the semiconductor layer sequence 21.

The passivation layer 30 can comprise for example an oxide, nitride or oxynitride, thus for instance one of the materials described above in the general part for the separating layer, for example.

FIG. 5 shows a further exemplary embodiment of a semiconductor component 100 embodied as a semiconductor chip, in which, in comparison with the previous exemplary embodiment, the separating layer 4 extends beyond the transparent electrically conductive contact layer 1 and in particular at least partly also extends over the side surfaces adjacent to the top side of the semiconductor layer sequence 21. In this case, the separating layer 4 can simultaneously serve as a passivation layer of the semiconductor layer sequence 21, such that it can be possible for an additional passivation layer, such as the passivation layer 30 shown in FIG. 4, not to be necessary. In particular, the second metallic contact layer 3 of the electrical contact structure 10 can be exposed and not covered by any passivation layer.

The exemplary embodiments and features described in association with the figures can also be combined with one another in accordance with further exemplary embodiments, even if such combinations are not explicitly described. Furthermore, the exemplary embodiments shown in the figures can have further or alternative features in accordance with the description in the general part.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An electrical contact structure for a semiconductor component comprising:
   a transparent electrically conductive contact layer, on which a first metallic contact layer is applied;
   a second metallic contact layer, which completely covers the first metallic contact layer; and
   a separating layer, which is arranged between the transparent electrically conductive contact layer and the second metallic contact layer and which separates the second metallic contact layer from the transparent electrically conductive contact layer,
   wherein a barrier layer is arranged between the first and second metallic contact layers, the barrier layer completely covering the first metallic contact layer and being covered by the second metallic contact layer,
wherein the barrier layer partly covers the separating layer.

2. The electrical contact structure according to claim 1, wherein the separating layer projects below the second metallic contact layer.

3. The electrical contact structure according to claim 1, wherein the barrier layer is arranged directly on the transparent electrically conductive contact layer in a region surrounding the first metallic contact layer.

4. The electrical contact structure according to claim 1, wherein the separating layer is transparent and comprises a dielectric material.

5. The electrical contact structure according to claim 1, wherein the separating layer comprises a plurality of layers.

6. The electrical contact structure according to claim 1, wherein the separating layer comprises an oxide, nitride or oxynitride.

7. The electrical contact structure according to claim 1, wherein the separating layer is spaced apart from the first metallic contact layer.

8. The electrical contact structure according to claim 1, wherein the separating layer covers the transparent electrically conductive contact layer over a large area apart from a region surrounding the first metallic contact layer.

9. The electrical contact structure according to claim 1, wherein the transparent electrically conductive contact layer comprises a transparent electrically conductive oxide or oxynitride.

10. The electrical contact structure according to claim 1, wherein the transparent electrically conductive contact layer comprises an indium-containing oxide or oxynitride.

11. The electrical contact structure according to claim 1, wherein the first metallic contact layer comprises aluminium and the second metallic contact layer comprises gold.

12. The electrical contact structure according to claim 1, wherein the separating layer comprises a silicon dioxide layer and a silicon nitride layer thereon, or wherein the separating layer comprises an aluminium oxide or tantalum oxide layer and a silicon dioxide layer thereon.

13. A semiconductor component, comprising:
a substrate, on which a semiconductor layer sequence is applied;
an electrical contact structure on a top side of the semiconductor layer sequence facing away from the substrate, the electrical contact structure comprising:
a transparent electrically conductive contact layer, on which a first metallic contact layer is applied;
a second metallic contact layer, which completely covers the first metallic contact layer; and
a separating layer, which is arranged between the transparent electrically conductive contact layer and the second metallic contact layer and which separates the second metallic contact layer from the transparent electrically conductive contact layer.

14. The semiconductor component according to claim 13, wherein the electrical contact structure comprises or forms a bonding pad and/or one or a plurality of conduction webs for current spreading.

15. The semiconductor component according to claim 13, wherein the semiconductor layer sequence comprises an optoelectronically active region.

16. The semiconductor component according to claim 13, wherein the semiconductor component has side surfaces adjacent to the top side and the separating layer extends at least partly over the side surfaces.

17. The semiconductor component according to claim 13, wherein the separating layer is arranged only on the top side of the semiconductor layer sequence, the semiconductor component has side surfaces adjacent to the top side, and a passivation layer at least partly covers the side surfaces and at least one portion of the separating layer on the top side.

18. An electrical contact structure for a semiconductor component comprising:
a transparent electrically conductive contact layer, on which a first metallic contact layer is applied;
a second metallic contact layer, which completely covers the first metallic contact layer; and
separating layer, which is arranged between the transparent electrically conductive contact layer and the second metallic contact layer and which separates the second metallic contact layer from the transparent electrically conductive contact layer,
wherein the separating layer projects below the second metallic contact layer,
wherein a barrier layer is arranged between the first and second metallic contact layers, the barrier layer completely covering the first metallic contact layer and being covered by the second metallic contact layer,
wherein the barrier layer partly covers the separating layer,
wherein the barrier layer is arranged directly on the transparent electrically conductive contact layer in a region surrounding the first metallic contact layer, and
wherein the separating layer is spaced apart from the first metallic contact layer.

19. An electrical contact structure for a semiconductor component comprising:
a transparent electrically conductive contact layer, on which a first metallic contact layer is applied;
a second metallic contact layer, which completely covers the first metallic contact layer; and
a separating layer, which is arranged between the transparent electrically conductive contact layer and the second metallic contact layer and which separates the second metallic contact layer from the transparent electrically conductive contact layer,
wherein the separating layer is spaced apart from the first metallic contact layer.

20. An electrical contact structure comprising:
a transparent electrically conductive contact layer;
a first metallic contact layer;
a separating layer;
a second metallic contact layer; and
a barrier layer,
wherein the second metallic contact layer completely covers the first metallic contact layer,
wherein the separating layer is arranged between the transparent electrically conductive contact layer and the second metallic contact layer,
wherein the separating layer separates the second metallic contact layer from the transparent electrically conductive contact layer, and
wherein the barrier layer partly covers the separating layer.

* * * * *

UNITED STATES PATENT AND TRADEMARK OFFICE
CERTIFICATE OF CORRECTION

PATENT NO. : 9,917,229 B2  
APPLICATION NO. : 15/313531  
DATED : March 13, 2018  
INVENTOR(S) : Korbinian Perzlmaier et al.

Page 1 of 1

It is certified that error appears in the above-identified patent and that said Letters Patent is hereby corrected as shown below:

In the Claims

In Column 16, Line 15-16 Claim 18:  
Replace "and separating layer", with --and a separating layer--.

Signed and Sealed this  
Fourteenth Day of August, 2018

Andrei Iancu  
*Director of the United States Patent and Trademark Office*